United States Patent
Van Lievenoogen et al.

(10) Patent No.: US 9,507,276 B2
(45) Date of Patent: Nov. 29, 2016

(54) POSITIONING DEVICE, CONTROL DEVICE AND CONTROL METHOD

(71) Applicant: KONINKLIJKE PHILIPS N.V., Eindhoven (NL)

(72) Inventors: Anne Johannes Wilhelmus Van Lievenoogen, Eindhoven (NL); Frank Bernhard Sperling, Nuenen (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/428,657

(22) PCT Filed: Sep. 27, 2013

(86) PCT No.: PCT/IB2013/058925
§ 371 (c)(1),
(2) Date: Mar. 17, 2015

(87) PCT Pub. No.: WO2014/057386
PCT Pub. Date: Apr. 17, 2014

(65) Prior Publication Data
US 2015/0235887 A1    Aug. 20, 2015

Related U.S. Application Data

(60) Provisional application No. 61/711,251, filed on Oct. 9, 2012.

(51) Int. Cl.
*G03F 7/20* (2006.01)
*H01L 21/68* (2006.01)
*G05B 15/02* (2006.01)

(52) U.S. Cl.
CPC ....... *G03F 7/70758* (2013.01); *G03F 7/70716* (2013.01); *G03F 7/70791* (2013.01); *G05B 15/02* (2013.01); *H01L 21/68* (2013.01)

(58) Field of Classification Search
CPC ... G05B 15/02; H01L 21/68; G03F 7/70716; G03F 7/70758; G03F 7/70791
See application file for complete search history.

(56) References Cited

U.S. PATENT DOCUMENTS 4,507,597 A * 3/1985 Trost ................... G03F 7/70716
269/58
5,815,246 A * 9/1998 Sperling ................ B23Q 1/621
269/73

(Continued)

FOREIGN PATENT DOCUMENTS

EP    0421527 A1    4/1991
EP    1017155 A1    7/2000

(Continued)

OTHER PUBLICATIONS

Vrijsen et al: "Comparison of Linear Voice Coil and Reluctance Actuators for High-Precision Applications"; 14th International Power Electronics and Motion Control Conference, EPE-PEMC, 2010, pp. S3-29-S3-36.

*Primary Examiner* — Mohamad Musleh

(57) ABSTRACT

The present invention relates to a positioning device, e.g. for use as a wafer stage, having a very stable temperature, a very low power consumption and a uniform temperature distribution. A long stroke stage (20) and a short stroke stage (50) are stacked upon each other. To initiate a movement of the long stroke stage (20) and the short stroke stage (50) in a desired movement direction (M1) the long stroke stage (20) is first moved in an opposite direction (M2) that is opposite to the desired movement direction (M1) and/or the short stroke stage (50) is first moved in the desired movement direction (M1) for a predetermined time interval and for a distance smaller than the distance (d) between a ferromagnetic center stroke element (52) and the closest one of two actuators (30, 40) in a stationary state of the long stroke stage (20). Subsequently, the long stroke stage (20) is moved in the desired movement direction (M1).

13 Claims, 7 Drawing Sheets

(56) References Cited

U.S. PATENT DOCUMENTS

| | | | |
|---|---|---|---|
| 6,130,517 A * | 10/2000 | Yuan | G03F 7/70816 318/593 |
| 7,253,576 B2 * | 8/2007 | Yang | H02P 25/06 310/12.28 |
| 7,352,149 B2 | 4/2008 | Butler et al. | |
| 7,456,935 B2 | 11/2008 | Cox et al. | |
| RE41,232 E | 4/2010 | Hazelton et al. | |
| 2003/0035088 A1 * | 2/2003 | Emoto | G03F 7/707 355/53 |
| 2003/0111912 A1 | 6/2003 | Binnard et al. | |
| 2005/0162802 A1 * | 7/2005 | Kho | G03F 7/70725 361/139 |
| 2011/0069293 A1 | 3/2011 | Hol et al. | |

FOREIGN PATENT DOCUMENTS

| | | |
|---|---|---|
| EP | 1316990 A2 | 6/2003 |
| JP | S61127104 A | 6/1986 |
| JP | 2009278127 A | 11/2009 |
| WO | 2004055607 A2 | 7/2004 |
| WO | 2007057842 A1 | 5/2007 |

* cited by examiner

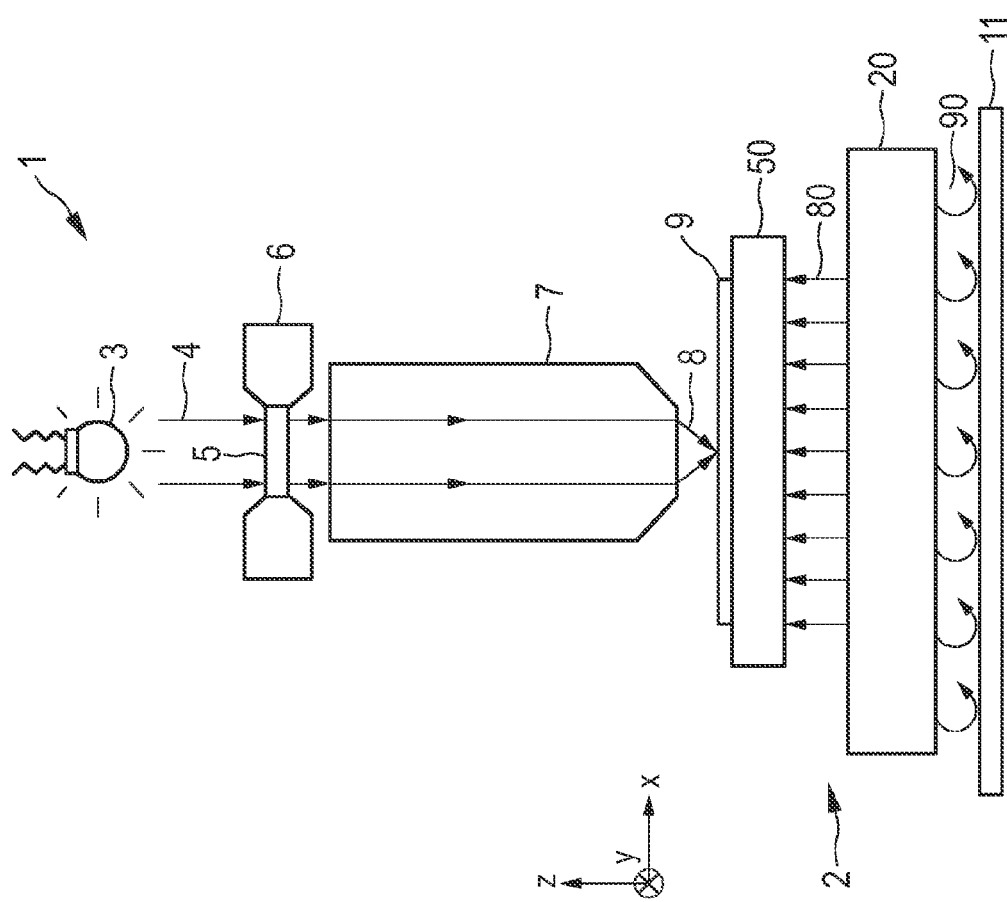

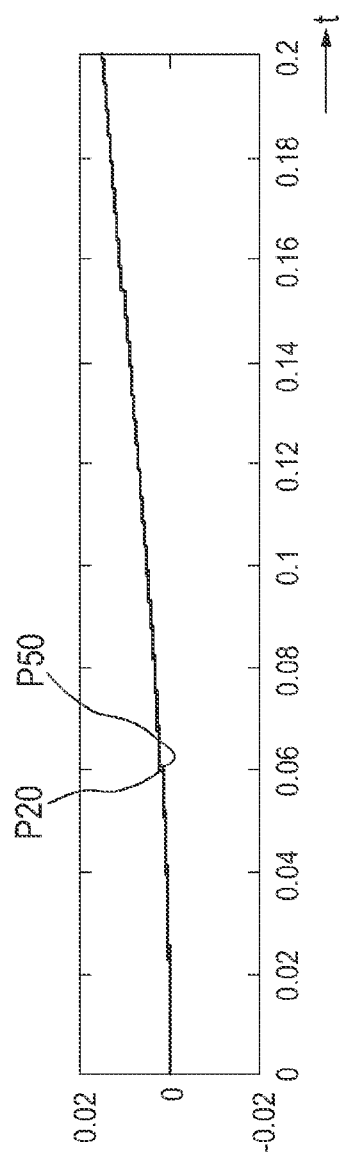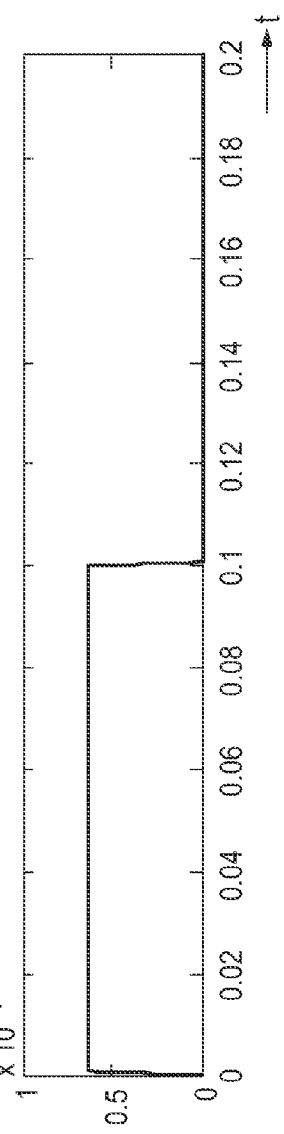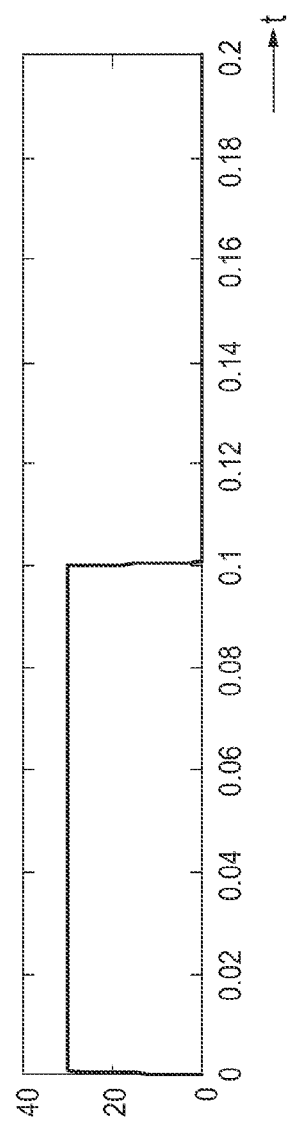

POSITIONING DEVICE, CONTROL DEVICE AND CONTROL METHOD

CROSS-REFERENCE TO PRIOR APPLICATIONS

This application is the U.S. National Phase application under 35 U.S.C. §371 of International Application No. PCT/IB2013/058925, filed on Sep. 27, 2013, which claims the benefit of U.S. Provisional Patent Application No. 61/711,251, filed on Oct. 9, 2012. These applications are hereby incorporated by reference herein.

FIELD OF THE INVENTION

The present invention relates to a positioning device, a control device and a control method.

BACKGROUND OF THE INVENTION

Positioning devices are generally known, e.g. from EP 0421527 A1, WO 2004/055607 A2 and WO 2007/057842 A1.

A known configuration of a high precision positioning device comprises two or more stages stacked on top of each other, where at least the top stage is full floating in 6 degrees of freedom. The top stage in this configuration typically has limited (up to 1 mm) strokes in the vertical directions and at least one limited stroke in the horizontal direction. The stages below this top stage will provide the long stroke in that direction.

The top stage typically holds an object to be positioned and often has a requirement to have a very stable temperature and a uniform temperature distribution as to not deform this object. Therefore it is important to limit the conduction of heat from the actuator to the rest of the top stage structure. Usually water cooling is used to transport the heat away from the actuator. This water cooling however forms a mechanical connection to the top stage and deteriorates the dynamic performance of the stage.

SUMMARY OF THE INVENTION

It is an object of the present invention to provide a positioning device having a very stable temperature, a very low power consumption and a uniform temperature distribution.

It is another object of the present invention to provide a control device and a control method for use in a positioning device for controlling said positioning device so as to provide a very stable temperature, a very low power consumption and a uniform temperature distribution.

In a first aspect of the present invention a positioning device is presented that comprises:

a support arrangement comprising one or more support elements, a long stroke stage that is supported by and movable in a movement direction with respect to a support element, the long stroke stage comprising a long stroke stage carrier element that is supported by a long stroke support element, a short stroke stage that is movable in the movement direction with respect to the long stroke stage, the short stroke stage comprising a short stroke stage carrier element that is supported by a short stroke support element, wherein the long stroke stage or the short stroke stage carries two actuators arranged opposing each other at a fixed distance with a gap in between, each actuator comprising a ferromagnetic yoke and a magnet arranged in the magnetic flux path of the yoke, and wherein the other one of the long stroke stage or the short stroke stage comprises a ferromagnetic center element that is arranged in between the actuators, a control unit for initiating a movement of the long stroke stage and the short stroke stage in a desired movement direction by first moving the long stroke stage in an opposite direction that is opposite to the desired movement direction and/or moving the short stroke stage in the desired movement direction for a predetermined time interval and for a distance smaller than the distance between the ferromagnetic center element and the closest actuator in a stationary state of the long stroke stage and then moving the long stroke stage in the desired movement direction.

In a further aspect of the present invention a control device for use in such a positioning device is presented wherein said control device is configured to initiate a movement of the long stroke stage and the short stroke stage in a desired movement direction by first moving the long stroke stage in an opposite direction that is opposite to the desired movement direction and/or moving the short stroke stage in the desired movement direction for a predetermined time interval and for a distance smaller than the distance between the ferromagnetic center element and the closest actuator in a stationary state of the long stroke stage and then moving the long stroke stage in the desired movement direction.

In a still further aspect of the present invention a corresponding control method for use in such a positioning device is presented.

In yet another aspect of the present invention, there is provided a computer program which comprises program code means for causing a computer to perform the steps of the control method when said computer program is carried out on a computer.

Preferred embodiments of the invention are defined in the dependent claims. It shall be understood that the claimed control device, control method and computer program have similar and/or identical preferred embodiments as the claimed positioning device and as defined in the dependent claims.

The present invention is based on the idea to provide a stacked stage configuration of a long stroke stage and a short stroke stage. Preferably, the short stroke stage is a top 6 DOF (degrees of freedom) floating stage and the bottom stage is a long stroke stage that makes the force to accelerate the entire mass of both stages in a certain movement direction. Although the stage on top does not move with respect to the bottom stage and thus performs no physical work, it has to generate a force to accelerate the top stage in the same direction. Typically, this force is generated by generating current through the coil of an electromagnetic actuator and thus generating heat. The present invention overcomes this problem by using the gap-dependency of the zero current resulting force of two opposing actuators mounted to the short stroke stage or the long stroke stage.

In particular, the gap dependency of the resulting force of the two opposing actuators, which are preferably hybrid reluctance actuators, is used to limit the power consumption of these actuators during acceleration in the direction of the actuators. To utilize this gap dependency of the actuators, the gap between at least a part of the short stoke stage and the long stroke stage in the movement direction of acceleration is actively changed by one of the stages, preferably by the long stroke stage, such that the resulting force of the two opposing actuators accelerates the other stage, in the preferred embodiment the short stroke stage, in the required movement direction. No or only little current is needed to produce this force, consequently no heat is generated to produce this force.

In general, the part of the positioning device long stroke stage and short stroke stage can be swapped as well as the motion sequence, i.e. several embodiments of arranging the stages and of the chronological order of movement of the stages are possible according to the present invention. In particular, any movement sequence that provides that during the initial acceleration into the opposite direction of the desired movement direction the accelerated stage (in particular the ferromagnetic center element thereof) is in an asymmetrical, off-centered (off-balanced) state with respect to the actuators can be used according to the present invention for control of the strokes. Further, the same idea can be used for deceleration.

The proposed positioning device preferably makes use of hybrid reluctance actuators as actuators in the long stroke or the short stroke stage, wherein the actuators are hybrid due to the use of a permanent magnet. In another embodiment actuators without permanent magnet, i.e. reluctance actuators, are used. Such hybrid reluctance actuators and their use in for long short stroke actuation and long stroke actuation are generally known, e.g. from the above mentioned WO 2007/057842 A1 and Vrijsen N. H., "Comparison of linear voice coil and reluctance actuators for high-precision applications", Power Electronics and Motion Control Conference (EPE/PEMC), 2010 14th International Conference, 6-8 Sep. 2010, which documents are herein incorporated by reference.

The present invention has the advantage of an increased lifetime performance since due to the reduced cooling needs there is a reduced need of cooling hoses, which are usually lifetime limiting. Further, the dynamical performance is increased since due to the absence of a need of cooling hoses, which form an unpredictable mechanical link to the stage below, the performance of the top stage is improved. Still further, reduced system complexity and cost are reduced due to a reduced number of hoses to a stage. Finally, the positioning device is contamination free since water hoses consume a large part of the outgassing budget in a vacuum system.

Generally, the yokes may have any form. In an embodiment the yokes each have an E-shape, U-shape or C-shape which are well guiding the magnetic flux in the desired direction.

Preferably, the yokes each have an E-shape and the magnet is a permanent magnet arranged on top of the central leg of the respective yoke, which represents a completely passive embodiment. This embodiment provides that no current is required.

In another embodiment, the yokes each have an E-shape and the magnet is an electromagnet formed by a coil wound around the central leg of the respective yoke. This embodiment provides that the actuator is more efficient because a very small can be achieved and the smaller the gap the more efficient the actuator.

In still another embodiment the yokes each have an E-shape and the magnet comprises a permanent magnet arranged on top of the central leg of the respective yoke and an electromagnet formed by a coil wound around the central leg of the respective yoke, i.e. hybrid reluctance actuators are used. In this practical configuration the short strokes of the short stroke stage are actuated using hybrid reluctance actuators consisting of a yoke in an E shape with a coil wound around the middle leg of the E-shaped yoke, and with a permanent magnet attached on top of the middle leg E. The zero current pulling force of such a hybrid actuator caused by the permanent magnet is compensated by gravity in the vertical directions and by a second hybrid actuator pulling in the opposite direction for the horizontal directions. The two opposing forces are only equal at one particular gap size. In all of the other gap sizes, a resulting force remains on the short stroke stage. This also holds if only a permanent magnet is used as magnet in the actuators.

Further, in an embodiment the positioning device having coils wound around the central leg of the yoke further comprises a current source for providing a current to the coils for stabilizing and/or controlling the position of the ferromagnetic center element.

In case of U-shaped or C-shaped yokes a magnet may be provided anywhere in the yoke, as long as the north-south pole direction of the magnet coincides with the magnetic flux path through the yoke.

In a preferred embodiment the control unit is configured to initiate a movement of the long stroke stage in the desired movement direction by first moving the long stroke stage in the opposite direction and/or by moving the short stroke stage in the desired movement direction for such a predetermined time and such a distance that the ferromagnetic center element does not get in contact with an actuator. For this purpose the control unit can be preprogrammed, or an adaptive control (on the fly) can be provided. In still another embodiment an additional feedback system (control loop) is provided in order to control or stabilize the motor gaps. For instance, the feedback system has the sum of the two short stroke actuator currents as input and its output is added to the long stroke setpoint.

Advantageously, the control unit comprises a movement actuator for effecting a movement of the long stroke stage and/or the short stroke stage and a controller for controlling the movement actuator. Any kind of actuator can be provided for this purpose.

Preferably, the two actuators are mounted on the long stroke stage carrier element and the ferromagnetic center element is mounted on the short stroke stage carrier element. Alternatively, the two actuators are mounted on the short stroke stage carrier element and the ferromagnetic center element is mounted on the long stroke stage carrier element.

BRIEF DESCRIPTION OF THE DRAWINGS

These and other aspects of the invention will be apparent from and elucidated with reference to the embodiment(s) described hereinafter. In the following drawings:

FIG. 1 shows a schematic diagram of an embodiment of a wafer scanner including a positioning device according to the present invention, FIG. 3 shows diagrams of the set points of the long stroke stage and the short stroke stage, the gap between the stages and the resulting zero current force.

DETAILED DESCRIPTION OF THE INVENTION

Figure 2A:
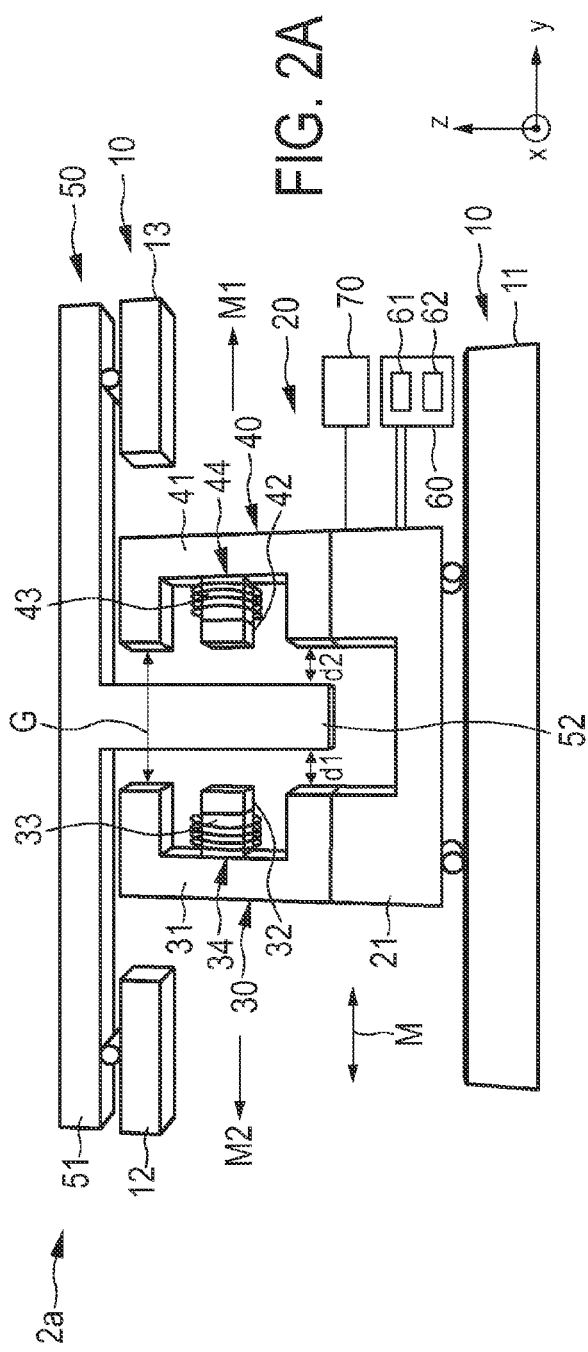
FIG. 2A shows a schematic diagram of an embodiment of a positioning device according to the present invention in an initial stage.

FIG. 1 shows a schematic diagram of a wafer scanner 1 including a positioning device 2 (also called wafer stage) according to the present invention. The wafer scanner 1 further comprises a light source 3 (in particular a laser) which emits a light beam 4 in the direction of a reticle (mask) 5 held by a reticle stage 6. The light beam is then converted by a projection lens 7 into a focused beam 8 that is focused onto a wafer 9 placed on top of the positioning device 2. To provide a high accuracy in the positioning of the wafer 9 the positioning device 2 comprises two stages stacked upon each other, in particular a short stroke stage 10 stacked upon a long stroke stage 20. In an exemplary embodiment the short stroke stage 10 has a millimeter range with nanometer accuracy while the long stroke stage 20 has a centimeter or meter range with sub-micrometer accuracy. In between the two stages z-actuators 80 are provided in this exemplary embodiment for providing movements of the short stroke stage 50 in z-direction, and between the long stroke stage 20 and a long stroke stage carrier element 11 one or more magnetic bearings 90 are provided.

Usually voice coil (Lorentz) actuators are applied for high-precision applications, because of the low variation of the force with motion. Nowadays, the throughput and the accuracy are the major issues in the development of new wafer scanners. To increase the throughput, the weight of the short stroke stage will be reduced, and hence, the wafer stage cannot be considered as a rigid body. To control the dynamics in the z-direction, reluctance actuators are considered and it was found that the power dissipation of a C-core reluctance actuator can be much lower compared to voice coil actuators.

Moreover, other reluctance actuator topologies are investigated, such as actuators that can apply a force in two directions or actuators that are pre-biasing with permanent magnets. A bidirectional force is necessary for this application, and by pre-biasing the static power dissipation can be reduced.

The short stroke stage that holds the object to be positioned is often implemented by a 6 DOF (degrees of freedom) floating stage. In some embodiments the short stroke stage can be moved by a short stroke in x- and/or y-direction. However, in other embodiment the short stroke stage (i.e. the top stage) may e.g. have a long stroke in x-direction (e.g. by +/−360 mm) and short strokes (e.g. by +/−0.3 mm) in all other directions. Hence, this stage will be referred to as short stroke Y.

The long stroke stage below is also often implemented by a 6 DOF floating stage. In some embodiments the long stroke stage can be moved by a long stroke in x- and/or y-direction. However, in other embodiment the long stroke stage has a long stroke in y-direction (e.g. by +/−150 mm) and a short stroke (e.g. by +/−0.5 mm) in all other directions. Hence, this stage will be referred to as long stroke Y.

In the following such an embodiment (having a long stroke stage in y-direction and a short stroke stage in y-direction) will be used to illustrate details of the present invention. However, the invention can also be used in other embodiments where the short stroke and the long stroke are provided in other directions.

Figure 2B:
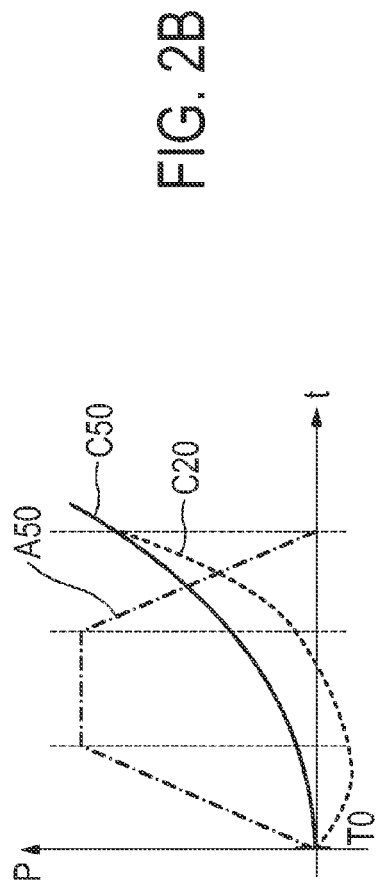
FIG. 2B shows a diagram of the movement curves of the short stroke stage and the long stroke stage over time indicating the initial stage during an acceleration phase of motion.

FIG. 2A shows a side view of such an embodiment of a positioning device 2a according to the present invention in an initial state. FIG. 2B shows a diagram of the movement curves (i.e. the movement position P over time t) of the short stroke stage 20 (movement curve C20) and of the long stroke stage 50 (movement curve S50). Further, the acceleration A50 of the short stroke stage 50 is indicated in FIG. 2B. The initial state is indicated as T0 in FIG. 2B.

The positioning device 2a comprises a support arrangement 10 comprising one or more support elements 11, 12, 13. The long stroke support element 11 supports the long stroke stage 20 and the short stroke support elements 12, 13 support the short stroke stage 20.

The long stroke stage 20 is movable in a movement direction M (which corresponds to the y-direction in this embodiment) with respect to the long stroke support element 11. It comprises a long stroke stage carrier element 21 that is supported by the long stroke support element 11 and two actuators 30, 40 that are carried by the long stroke stage carrier element 21. The actuators 30, 40 are arranged opposing each other at a fixed distance with a gap G in between. Each actuator 30, 40 comprises a ferromagnetic E-shaped yoke 31, 41 and a permanent magnet 32, 33 that is arranged in the respective magnetic flux path of the respective yoke 31, 41. The north-south axis is particularly arranged along the central leg 34, 44 of the respective E-shaped yoke 31, 41, i.e. either the north pole is arranged at the magnet tip facing the ferromagnetic center element 52 and the south pole is at the side facing main bar of the respective yoke or vice-versa. Further, in this embodiment an electromagnet 33, 43 formed by a coil wound around the central leg 34, 44 of the respective yoke 31, 41 is provided.

The short stroke stage 50 is also movable in the movement direction M with respect to the long stroke stage 20. It comprises a short stroke stage carrier element 51 that is supported by the short stroke support elements 12, 13 and a ferromagnetic center element 52 that is arranged in between the actuators 30, 40, i.e. within the gap G.

In the shown initial state the ferromagnetic center element 52 is arranged centrally within the gap G, i.e. the distance d1 between the left side actuator 30 and the ferromagnetic center element 52 and the distance d2 between the right side actuator 40 and the ferromagnetic center element 52 are equal.

Additionally, a control unit 60 is provided for initiating a movement of the long stroke stage 20 and the short stroke stage 50 in a desired movement direction M1. For this purpose the movement is controlled by first moving the long stroke stage 20 in an opposite direction M2 that is opposite to the desired movement direction M1 and/or moving the short stroke stage 50 in the desired movement direction M1 for a predetermined time interval and for a distance smaller than the distance d between the ferromagnetic center element 52 and the closest actuator 30, 40 in a stationary state (as shown in FIG. 2A) of the long stroke stage 20 and then moving the long stroke stage 20 in the desired movement direction M1. This will be illustrated in more detail below by reference to FIGS. 3 to 5 showing different movement states in chronological order.

The proposed control is particularly used when the entire stage assembly (comprising both stages 20, 50) accelerates in a desired movement direction (here in this example the y-direction). Generally, the long stroke stage 20 generates a force large enough to accelerate both the long stroke stage 20 and the short stroke stage 50. However, the short stroke stage 50 has to generate a force in y-direction to accelerate itself as fast as the long stroke stage 20 is accelerating in y-direction.

To generate this force the gap (indicated by d in FIG. 2A) between the long stroke stage 20 and the short stroke stage 50 is changed according to the present invention. To realize this, the set point for the long stroke stage 20 in y-direction is different than the set point for the short stroke stage 50 in y-direction. The set point of the long stroke stage 20 is calculated by taking the set point position of the short stroke stage 50 and adding the necessary gap for generating the required force for accelerating the short stroke stage, i.e. $P_{long\ stroke} = P_{short\ stroke} + P_{gap\_offset}$ with the $P_{gap\_offset}$ being non-zero during acceleration and being a function that preferably uses a model of the actuator to calculate the required gap offset.

Preferably, as shown in FIG. 2A the control unit 60 comprises a movement actuator 61 for effecting a movement of the long stroke stage 20 and a controller 62 for controlling the movement actuator 61. Further, a current source 70 is preferably provided for providing a current to the coils 33, 43 for stabilizing and/or controlling the position of the ferromagnetic center element 52. Preferably, for this purpose a position sensing device is provided with respect to the fixed environment e.g. an interferometric device.

FIG. 3A shows an exemplary diagram of the set points of the long stroke stage (curve P20) and the short stroke stage (curve P50) during an acceleration in y-direction. This figure shows a third order set point for the short stroke. For the long stroke stage 20 this results in discontinuities in the acceleration of the long stroke. If a fourth order set point is used for the short stroke, this problem is solved. FIG. 3B shows a diagram of the gap size over time between the stages, i.e. between the ferromagnetic center element 52 and the closest actuator 30 or 40 (depending on the movement direction). FIG. 3C shows a diagram of the resulting zero current force between the two actuators over time.

The different movement phase are illustrated with reference to FIGS. 4 to 6 showing the embodiment of the positioning device 2a shown in FIG. 2A in three subsequent movement phases and a diagram of the movement curves indicating the respective movement position.

Figure 4A:
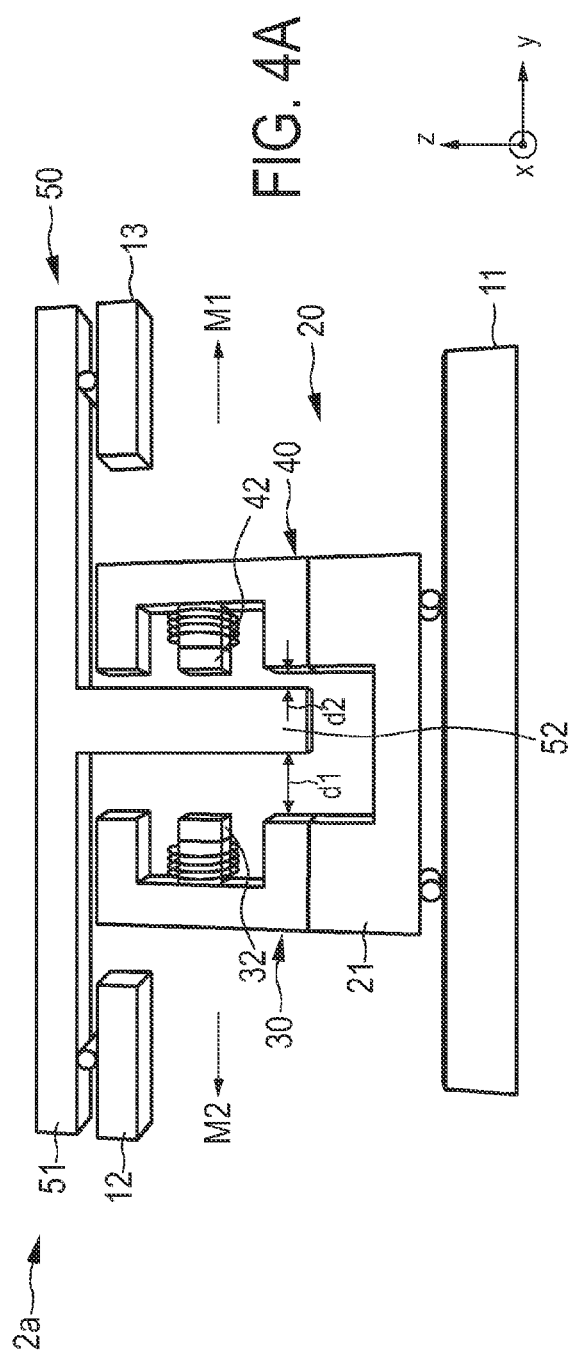
FIG. 4A shows a schematic diagram of the positioning device shown in FIG. 2 in a first movement stage.
Figure 4B:
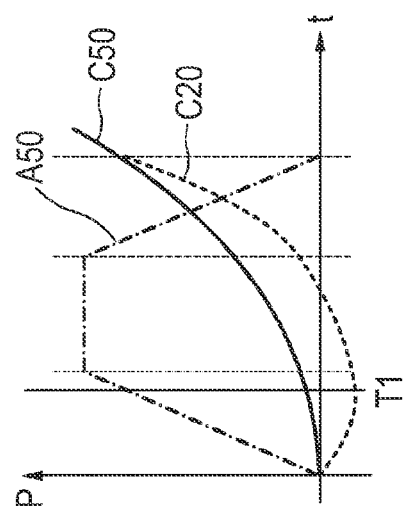
FIG. 4B shows a diagram of the movement curves of the short stroke stage and the long stroke stage over time indicating the first movement stage.

FIG. 4A shows the positioning device 2a in a first movement position indicated in FIG. 4B at time T1. In this movement phase the long stroke stage 20 deliberately creates a bias force by moving in the opposite direction M2, i.e. the direction opposite to the desired movement direction M1. This can be seen in FIG. 4B from the curve C20 (showing the position of the long stroke stage) being below the zero line at time T1. The ferromagnetic center element 52 is now no longer arranged centrally within the gap G, but the distance d1 has increased while the distance d2 has decreased. This has the effect that the short stroke stage 50 starts moving into the movement direction M1 as indicated by the respective curve C50 (showing the position of the short stroke stage) being above the zero line at time T1 as shown in FIG. 4B. This accelerating movement is solely (in the optimal case) achieved by the magnetic force exerted by the magnet 42. In the embodiment just coils as magnets it mainly helps to make the reluctance actuator more efficient.

Figure 5A:
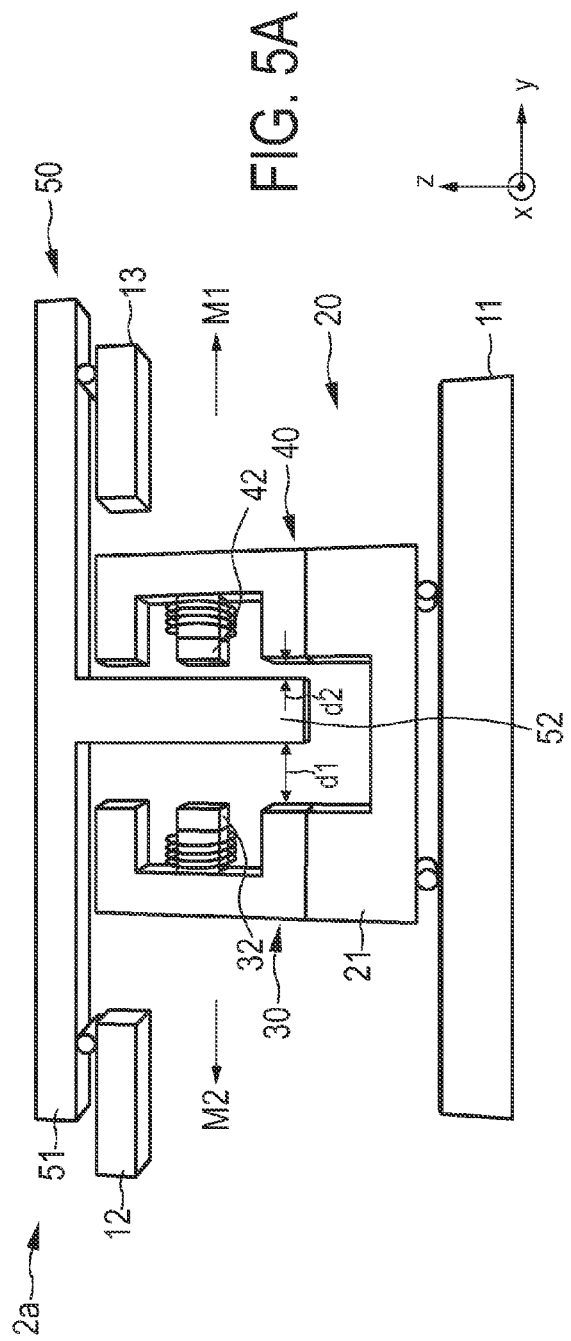
FIG. 5A shows a schematic diagram of the positioning device shown in FIG. 2 in a second movement stage.
Figure 5B:
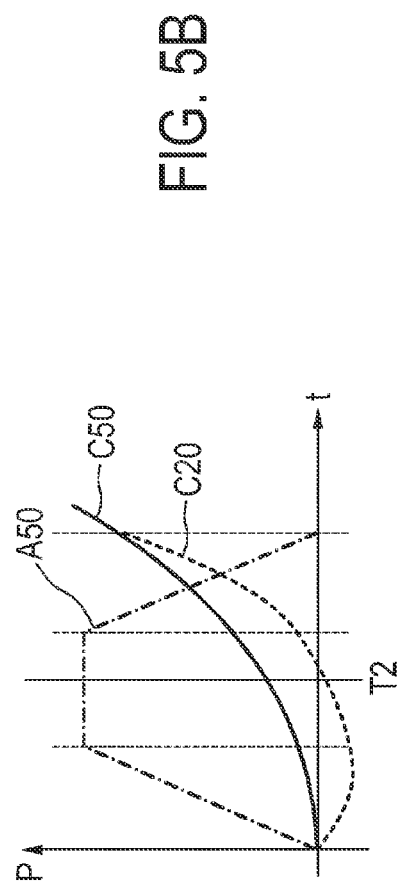
FIG. 5B shows a diagram of the movement curves of the short stroke stage and the long stroke stage over time indicating the second movement stage.

The long stroke stage 20 is moved, e.g. by an actuator (not shown), only for such a time duration and/or only such a distance that the short stroke stage 50 does not get in touch with the closest actuator, here the actuator 40. Thus, after the first initial movement of the long stroke stage 50 in the opposite direction M2, it is subsequently moved, e.g. by the (not shown) actuator, in the desired movement direction M1 as indicated in FIGS. 5A and 5B showing the second movement position indicated at time T2 in FIG. 5B. In this state the acceleration of the short stroke stage 50 is constant so that it continues moving into the movement direction with increasing velocity by use of the magnetic bias force exerted by the magnet 42.

Figure 6A:
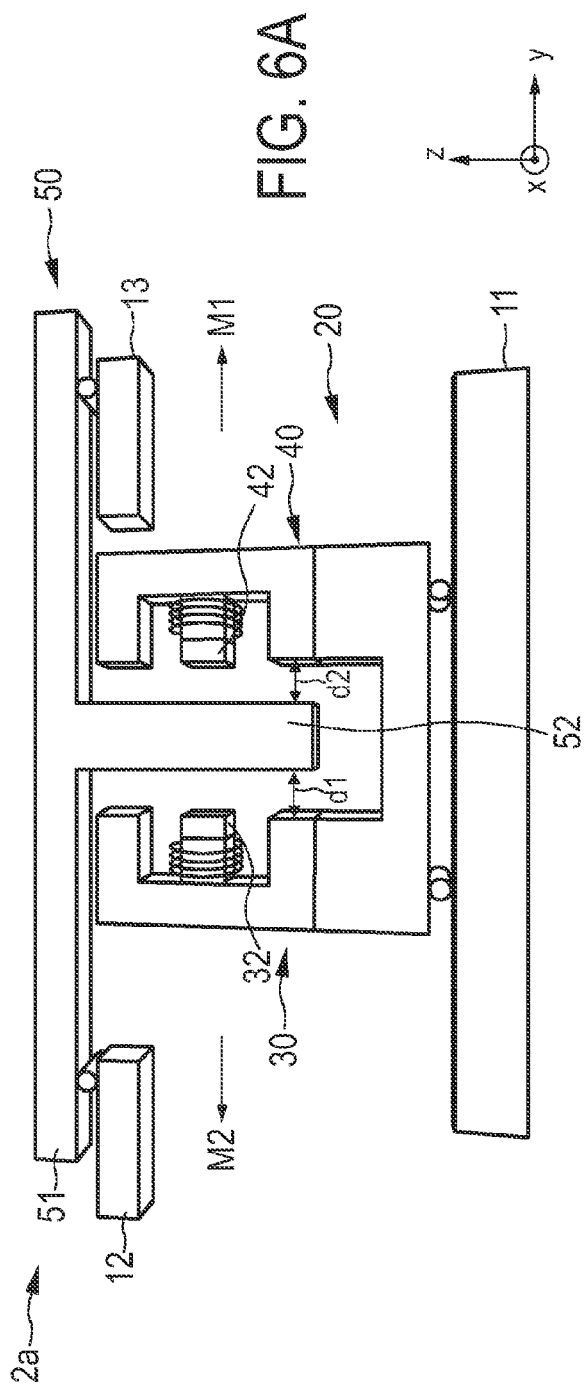
FIG. 6A shows a schematic diagram of the positioning device shown in FIG. 2 in a third movement stage.
Figure 6B:
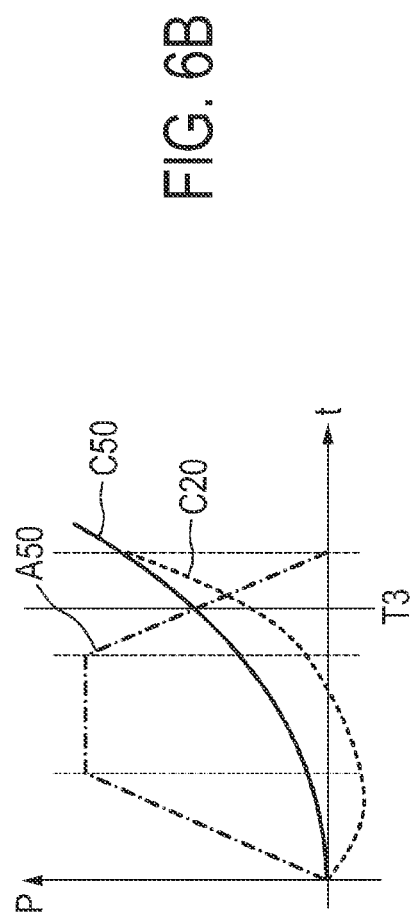
FIG. 6B shows a diagram of the movement curves of the short stroke stage and the long stroke stage over time indicating the third stage.

FIG. 6A shows the positioning device 2a in a third movement position indicated in FIG. 6B at time T3. In this movement phase acceleration of the short stroke stage 50 and of the long stroke stage 20 is decreased to zero (Jerk phase). After this movement phase the velocities of the short stroke stage 50 and long stroke stage 20 are constant, and as in the initial state shown in FIG. 2A the ferromagnetic center element 52 is arranged centrally within the gap G, i.e. the distances d1 and d2 are equal. Consequently, no further magnetic bias force is exerted by the magnet 42 (or the magnet 32) on the ferromagnetic center element 52.

Thus, by the positioning device 2a having a long stroke and short stroke actuator configuration is used to achieve a high (e.g. nm range) positioning accuracy. In this embodiment hybrid reluctance type actuators are used with bias flux from permanent magnets. In the path planning the reluctance motor gaps are controlled to deliberately induce a bias force and use this bias force for initiating the motion of the short stroke stage. This provides the advantage that an electrical actuation of the stage assembly (may also be called motor) is only required for stabilization (motors inherently act at an unstable equilibrium) resulting in practically zero power consumption. Since hardly any power is used, alternative methods of controlling the actuators can be employed, e.g. manipulating the magnetic resistance of an E-core actuator.

In a variation of the embodiment of the positioning device 2a shown in FIGS. 2, 4 to 6 rather than initially moving the long stroke stage 20 into to opposition direction to achieve the generation of the bias force by use of the magnet 42 on the ferromagnetic center element, the short stroke stage 50 may be initially moved to the desired movement direction M1 to decrease the distance d2. During this phase the long stroke stage 20 is not moved actively. This results in basically the same situation as shown in FIG. 4A. Thus, in an embodiment an actuator is provided for effecting this initial movement of the short stroke stage 50. Alternatively, if provided the coils 33, 43 can be used for this purpose. Thereafter, the long stroke stage 20 (and potentially also the short stroke stage 50) is moved into the desired movement direction M1 until both stages 20, 50 have accelerated and are moving with constant velocity.

Thus, for the constant velocity trajectory the short stroke stage 50 moves back to the center with respect to long stroke stage 20. During deceleration it moves in the M2 direction with respect to the long stroke stage 20.

The deceleration generally works in the same as the acceleration but the relative moves are in the opposite direction to create a bias force in the opposite direction.

Figure 7:
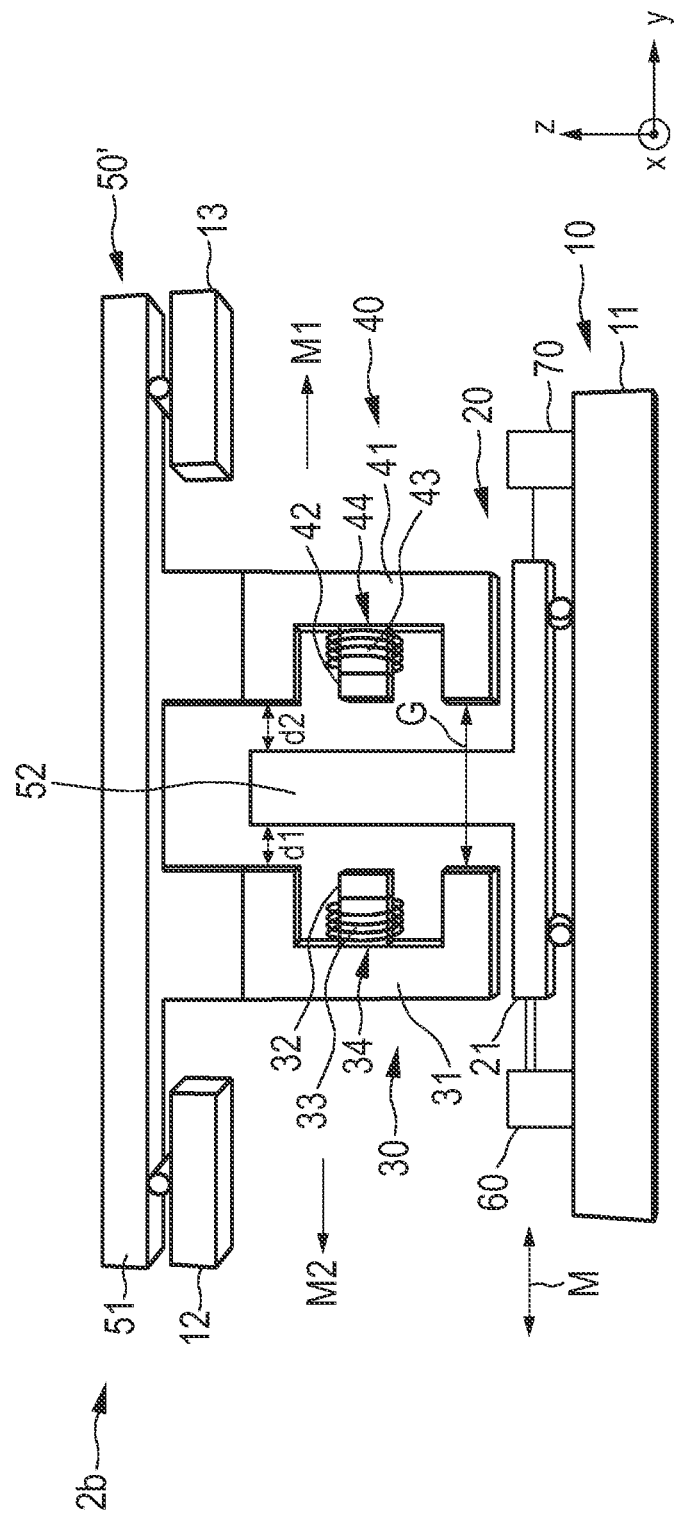
FIG. 7 shows a schematic diagram of another embodiment of a positioning device according to the present invention in an initial stage.

FIG. 7 shows a schematic diagram of another embodiment of a positioning device 2b according to the present invention in an initial stage. This positioning device 2b basically comprises the same elements as the positioning device 2a, but some elements are interchanged between the stages 20, 50. In particular, the two actuators 30, 40 are part of the short stroke stage 50 and are mounted to the short stroke stage carrier element 51. The ferromagnetic center element 52 is part of the long stroke stage 20 and is mounted to the long stroke stage carrier element 21. Apart from that the control and the function of the positioning device 2b is substantially the same as explained above for the positioning device 2a, i.e. there exist also the two variations of the control as explained above.

In a particular embodiment the control and the setpoint paths result in acceleration forces acting on the short stroke stage 50 provided by both the permanent magnets in addition to the reluctance forces of the motor coils.

In an alternative embodiment the control and setpoint paths result in acceleration forces acting of the short stroke stage 50 provided by the permanent magnets and these being the majority of the acceleration forces acting on the short stroke.

In the embodiments depicted in the figures both permanent magnets 32, 42 and electromagnets (provided basically by the coils 33, 43) are provided. For effecting the above described control and movement of the stages it is generally possible that only permanent magnets 32, 42 or electromagnets (provided basically by the coils 33, 43) are provided and used for generating the bias force in certain movement stages.

Potential application areas of the present invention are semiconductor manufacturing equipment, electronics assembly, mechanization, general usage positioning stages for positioning of samples and/or substrates in reactive or aggressive environments (thus particularly requiring less or no cabling, sparking, lubricants), positioning devices for application in vacuum environments, and production equipment.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A positioning device comprising:
   a support arrangement comprising one or more support elements,
   a long stroke stage that is supported by and movable in a movement direction with respect to a support element, the long stroke stage comprising a long stroke stage carrier element that is supported by a long stroke support element,
   a short stroke stage that is movable in the movement direction with respect to the long stroke stage, the short stroke stage comprising a short stroke stage carrier element that is supported by a short stroke support element,
   wherein the long stroke stage or the short stroke stage carries two actuators arranged opposing each other at a fixed distance with a gap in between, each actuator comprising a ferromagnetic yoke and a magnet arranged in the magnetic flux path of the yoke, and wherein the other one of the long stroke stage or the short stroke stage comprises a ferromagnetic center element that is arranged in between the actuators,
   a control unit for initiating a movement of the long stroke stage and the short stroke stage in a desired movement direction by first moving the long stroke stage in an opposite direction that is opposite to the desired movement direction and/or moving the short stroke stage in the desired movement direction for a predetermined time interval and for a distance smaller than the distance (d) between the ferromagnetic center element and the closest actuator in a stationary state of the long stroke stage and then moving the long stroke stage in the desired movement direction.

2. The positioning device as claimed in claim 1, wherein the yokes each have an E-shape, U-shape or C-shape.

3. The positioning device as claimed in claim 1, wherein the yokes each have an E-shape and wherein the magnet is a permanent magnet arranged on top of the central leg of the respective yoke.

4. The positioning device as claimed in claim 1, wherein the yokes each have an E-shape and wherein the magnet is an electromagnet formed by a coil wound around the central leg of the respective yoke.

5. The positioning device as claimed in claim 1, wherein the yokes each have an E-shape and wherein the magnet comprises a permanent magnet arranged on top of the central leg of the respective yoke and an electromagnet formed by a coil wound around the central leg of the respective yoke.

6. The positioning device as claimed in claim 4, further comprising a current source for providing a current to the coils for stabilizing and/or controlling the position of the ferromagnetic center stroke element.

7. The positioning device as claimed in claim 1, wherein the control unit is configured to initiate a movement of the long stroke stage in the desired movement direction by first moving the long stroke stage in the opposite direction and/or by moving the short stroke stage in the desired movement direction for such a predetermined time and such a distance that the ferromagnetic center element does not get in contact with an actuator.

8. The positioning device as claimed in claim 1, wherein the control unit comprises a movement actuator for effecting a movement of the long stroke stage and/or the short stroke stage and a controller for controlling the movement actuator.

9. The positioning device as claimed in claim 1, wherein the two actuators are mounted on the long stroke stage carrier element and wherein the ferromagnetic center element is mounted on the short stroke stage carrier element.

10. The positioning device as claimed in claim 1, wherein the two actuators are mounted on the short stroke stage carrier element and wherein the ferromagnetic center element is mounted on the long stroke stage carrier element.

11. A control device for use in a positioning device comprising a support arrangement comprising one or more support elements, a long stroke stage that is supported by and movable in a movement direction with respect to a support element, the long stroke stage comprising a long stroke stage carrier element that is supported by a long stroke support element, a short stroke stage that is movable in the movement direction with respect to the long stroke stage, the short stroke stage comprising a short stroke stage carrier element that is supported by a short stroke support element, wherein the long stroke stage or the short stroke stage carries two actuators arranged opposing each other at a fixed distance with a gap in between, each actuator comprising a ferromagnetic yoke and a magnet arranged in the magnetic flux path of the yoke, and wherein the other one of the long stroke stage or the short stroke stage comprises a ferromagnetic center element that is arranged in between the actuators, said control device being configured to initiate a movement of the long stroke stage and the short stroke stage in a desired movement direction by first moving the long stroke stage in an opposite direction that is opposite to the desired movement direction and/or moving the short stroke stage in the desired movement direction for a predetermined time interval and for a distance smaller than the distance between the ferromagnetic center stroke element and the closest actuator in a stationary state of the long stroke stage and then moving the long stroke stage in the desired movement direction.

12. A control method for use in a positioning device, comprising a support arrangement comprising one or more support elements, a long stroke stage that is supported by and movable in a movement direction with respect to a support element, the long stroke stage comprising a long stroke stage carrier element that is supported by a long stroke support element, a short stroke stage that is movable in the movement direction with respect to the long stroke stage, the short stroke stage comprising a short stroke stage carrier element that is supported by a short stroke support element, wherein the long stroke stage or the short stroke stage carries two actuators arranged opposing each other at a fixed distance with a gap in between, each actuator comprising a ferromagnetic yoke and a magnet arranged in the magnetic flux path of the yoke, and wherein the other one of the long stroke stage or the short stroke stage comprises a ferromagnetic center element that is arranged in between the actuators, said control method comprising the step of initiating a movement of the long stroke stage and the short stroke stage in a desired movement direction by first moving the long stroke stage in an opposite direction that is opposite to the desired movement direction and/or moving the short stroke stage in the desired movement direction for a predetermined time interval and for a distance smaller than the distance between the ferromagnetic center stroke element and the closest actuator in a stationary state of the long stroke stage and then moving the long stroke stage in the desired movement direction.

13. Computer program comprising program code means for causing a computer to carry out the steps of the method as claimed in claim 12 when said computer program is carried out on the computer.

* * * * *